United States Patent [19]
Aoki

[11] Patent Number: 4,886,334
[45] Date of Patent: Dec. 12, 1989

[54] OPTICAL AMPLIFYING REPEATER

[75] Inventor: Yasuhiro Aoki, Tokyo, Japan

[73] Assignee: NEC Corporation, Tokyo, Japan

[21] Appl. No.: 239,352

[22] Filed: Sep. 1, 1988

[30] Foreign Application Priority Data

Sep. 1, 1987 [JP] Japan ................................. 62-219430
Sep. 1, 1987 [JP] Japan ................................. 62-219431

[51] Int. Cl.$^4$ ............................................. G02B 6/00
[52] U.S. Cl. .................................. 350/96.15; 455/616; 350/96.16
[58] Field of Search .................. 350/96.15, 96.16, 388, 350/96.13, 96.14; 455/616, 313

[56] References Cited

U.S. PATENT DOCUMENTS 4,752,120 6/1988 Shimizu ............................ 350/96.13

OTHER PUBLICATIONS

Y. Iwamoto & H. Fukinuki, "Recent Advances in Submarine Optical Fiber Cable Transmission Systems in Japan", Journal of Lightwave Technology, vol. LT-3, No. 5, Oct. 1985, pp. 1005–1016.
J. C. Simon, "Semiconductor Laser Amplifier for Single Mode Optical Fiber Communications", J. Opt. Commun. 4 (1983)2, pp. 51–62.
"Optical System with Two Packaged 1.5 um Semiconductor Laser Amplifier Repeaters", Electronics Letters, Feb. 27, 1986, vol. 22, No. 5, pp. 253–255.

*Primary Examiner*—William L. Sikes
*Assistant Examiner*—Akm E. Ullah
*Attorney, Agent, or Firm*—Sughrue, Mion, Zinn, Macpeak & Seas

[57] ABSTRACT

In an optical amplifying repeater, an input signal light which is propagated through a first transmission optical fiber is divided by an optical divider into a plurality of signal lights. Each of the signal lights is amplified in a corresponding optical amplifier among a plurality of optical amplifiers. The signal lights thus amplified are combined in an optical coupler to supply a second transmission optical fiber with a combined signal light. At least one of the optical amplifiers are controlled in its amplification gain so that a level of the combined signal light is held to be a predetermined value.

2 Claims, 4 Drawing Sheets

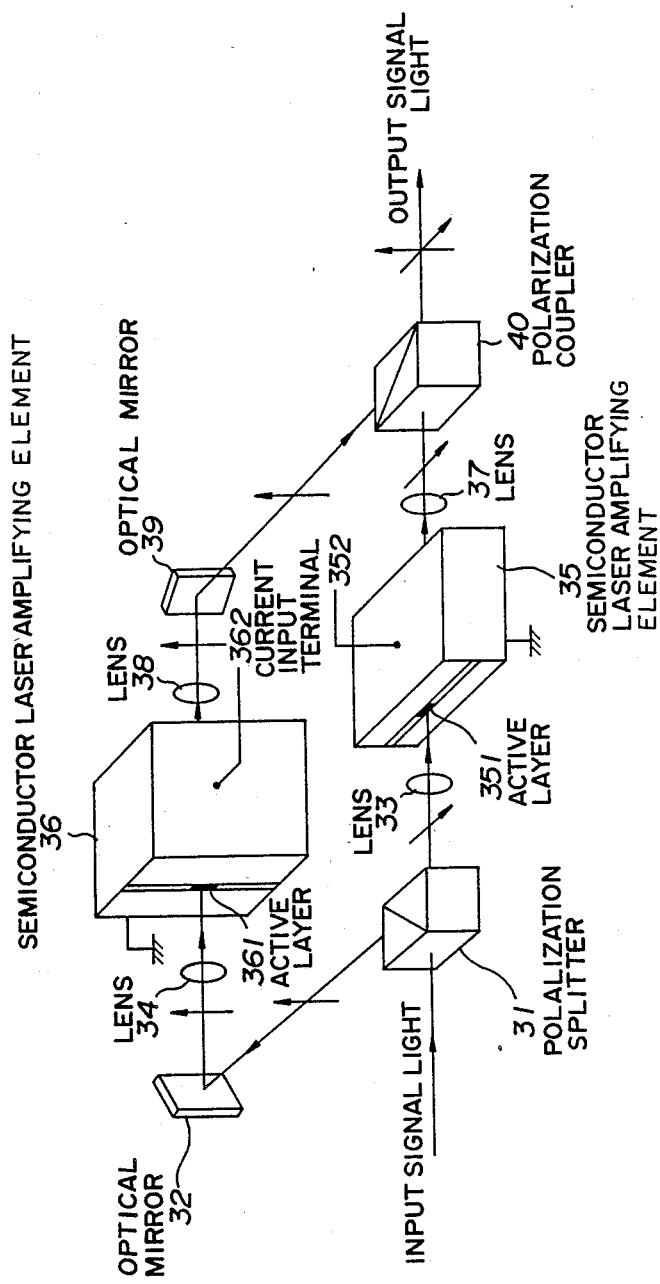

OPTICAL AMPLIFYING REPEATER

FIELD OF THE INVENTION

The invention relates to an optical amplifying repeater for optical communication use, and more particularly to an optical repeater in which a signal light is directly amplified without conversions between optical and electric signals.

BACKGROUND OF THE INVENTION

In an optical communication system, a signal light is inevitably attenuated and is circumvented a waveform distortion when propagating through an optical fiber transmission line due to the transmission loss and chromatic dispersion of the fiber, respectively. For this reason, a predetermined number of repeaters with predetermined intervals are required to construct a long distance optical communication system, so that the optical power and the waveform of signal light are recovered to their initial stages.

One of conventional repeaters for the optical communication system is described on pages 1005 to 1016 of "IEEE Journal of Lightwave Technology, Vol. LT-3, No. 5, October 1985". In the conventional repeater for the optical communication system, the signal light propagated through an optical fiber is received by a photodetector which is to be converted to an electric signal which is then amplified and reshaped in its waveform Then, the light source installed in the repeater is modulated by this electric signal, thus it emits the signal light having a reproduced optical power level and a shaped waveform. Then, the regenerated signal light is coupled to an optical fiber for a following stage.

However, the conventional repeater for the optical communication system described above has disadvantages, such that a probability for fault is high therein, a reliability thereof is low, a system size is large, and a system cost is high because a number of electrical devices are used in the repeater for the signal processing.

In order to overcome these disadvantages, an optical amplifying repeater in which the signal light is directly amplified without conversion between optical and electric signals is studied, for instance, as described on pages 51 to 62 of "Journal of Optical Communications, Vol. 4, 1983", and on pages 253 to 255 of "Electronics Letters, Vol. 22, 1986". The optical amplifying repeater is suitably applicable to an optical communication system in which waveform reshaping of the signal light is not under parameters, for instance, that the bit rate is lower than several hundreds M bps and the transmission length is less than 1000 km. Several kinds of semiconductor laser amplifiers are used for such an optical amplifying repeater, such as a Fabry-Perot type or a distributed feedback semiconductor laser which operate with an bias current below its oscillation threshold, and a travelling wave type semiconductor laser having antireflection coatings of a reflectivity less than several percents on both facets. In these optical semiconductor laser amplifiers, the signal light is amplified in the active layer by the stimulated emission effect.

In each of the aforementioned conventional optical semiconductor laser amplifiers, however, there is a problem that the amplification gain fluctuates both with the atmospheric temperature change and the polarization change of the signal light. In more detail, a refractive index of an active layer of a semiconductor laser amplifier is largely varied in accordance with the temperature change thereof. This results in a temperature dependence of the maximum gain wavelength of such a optical semiconductor laser amplifier by approximately 0.1 nm /°C.

There is another problem that an amplification gain of such an optical semiconductor laser amplifier is different for the transverse electric (TE) wave and transverse magnetic (TM) wave. This stems from the fact that mode confinement factor is different between the TE and TM waves because an active layer of the semiconductor laser amplifier is usually asymmetrical and a facet reflectivities are also different between the TE and TM waves.

Despite the polarization dependent gain of the semiconductor laser amplifier described above, it is difficult to propagate the signal light through the optical fiber such that polarization of the signal light is maintained to be constant in the optical fiber communication system. Furthermore, the polarization of the signal light is easily changed when unexpected external disturbance is applied to the optical fiber. For this reason, the optical power level of the signal light after amplification is fluctuated dependent on the polarization of input signal light in a case where one of the conventional optical semiconductor laser amplifiers is applied to the optical amplifying repeater. In order to overcome this problem, it is considered, for instance, that a polarization controller is provided on the input side of the optical semiconductor laser amplifier. However, the polarization controller presently available is not suitable for this application because it has a loss of more than several dB, and the long term stability thereof is still insufficient for such a long term use.

As described above, the conventional optical amplifying repeater is required to be improved in regard to a stability and a reliability, which are presently poor due to the aforementioned amplification gain fluctuation of the optical semiconductor laser amplifiers in accordance with both the atmospheric temperature change and the polarization change of the signal light. Furthermore, there is another problem for the conventional optical amplifying repeater that the transmission line is broken down when the optical semiconductor laser amplifier is damaged during the long term use.

SUMMARY OF THE INVENTION

Accordingly, it is an object of the invention to provide an optical amplifying repeater in which stability is improved.

It is a further object of the invention to provide an optical amplifying repeater in which a reliability is heightened so as to be applicable for long term use.

According to the invention, an optical amplifying repeater comprises a plurality of optical amplifiers, a monitor unit and a control circuit. An input signal light propagated through a first optical fiber is divided by an optical divider to be supplied to the plurality of the optical amplifiers. In the optical amplifiers, the divided signal lights are individually amplified. The amplified signal lights are then combined by an optical coupler to be supplied as an output signal light to a second optical fiber. The monitor unit detects a optical power level of the output signal light, and the control circuit controls at least one of the optical amplifiers in its amplification gain so that the optical power level of the output signal light is maintained to be a predetermined value.

BRIEF DESCRIPTION OF DRAWINGS

The invention will be explained in more detail in conjunction with appended drawings wherein, FIGS. 3 and 4 are explanatory diagrams showing optical semiconductor laser amplifiers applied to the embodiment according to the invention.

DESCRIPTION OF PREFERRED EMBODIMENTS

Figure 1:
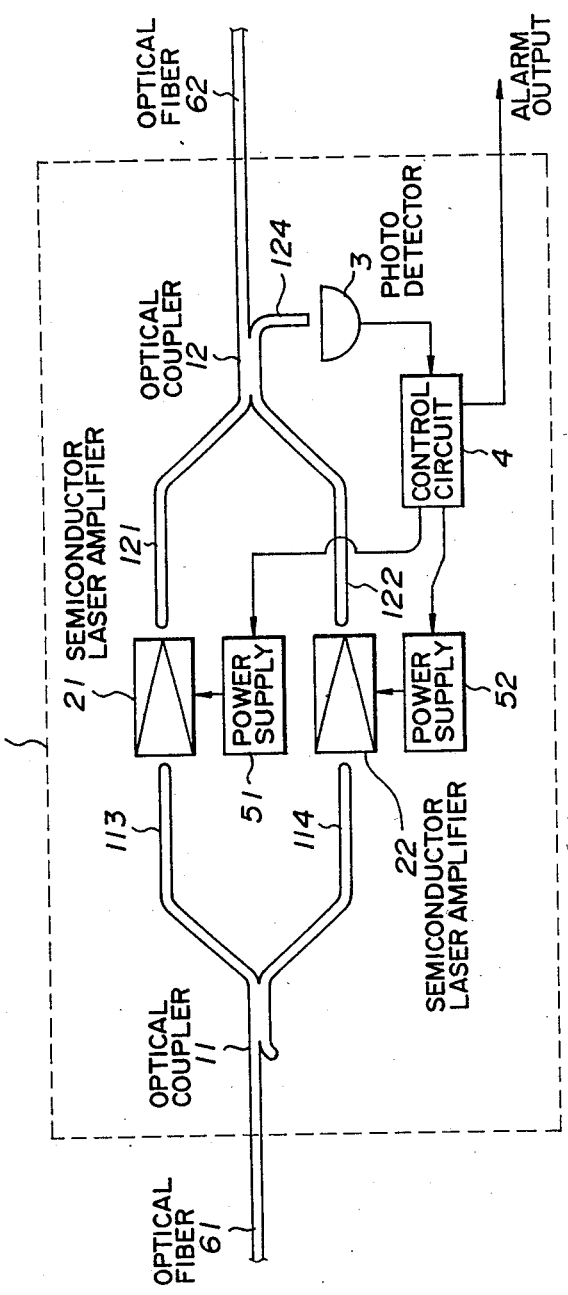
FIG. 1 is the block diagram showing an optical amplifying repeater in an embodiment according to the invention.
Figure 2:
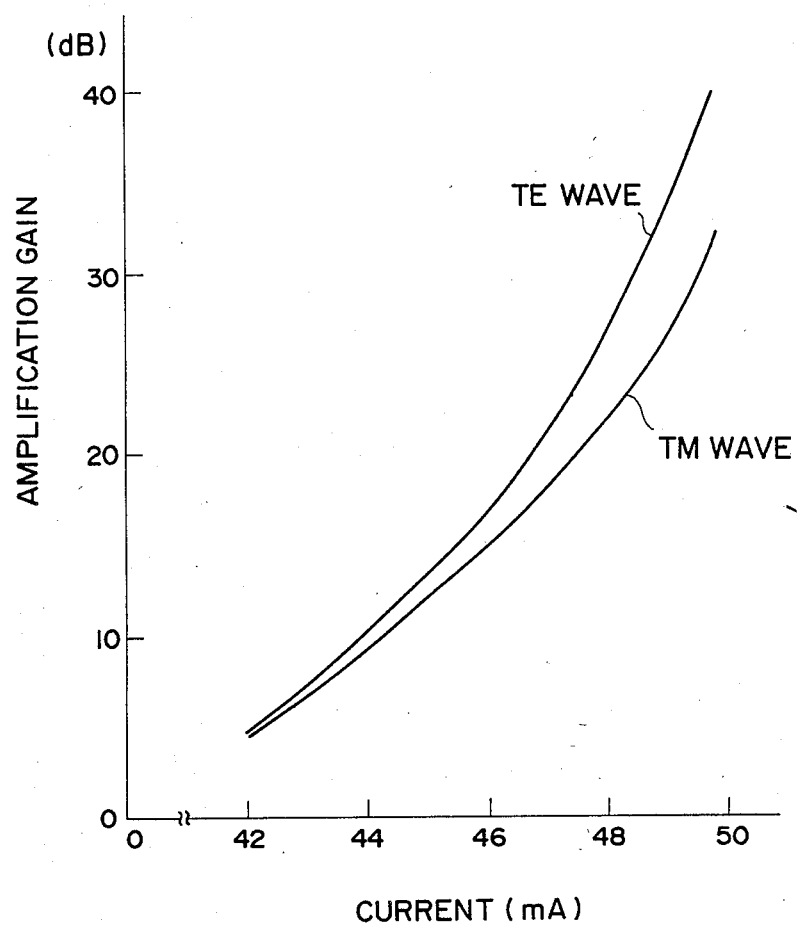
FIG. 2 is the amplification gain versus injection current characteristics of an optical semiconductor laser amplifier used for an optical amplifying repeater in the embodiment.

FIG. 1 shows an optical amplifying repeater 10 in an embodiment according to the invention. The optical amplifying repeater 10 comprises optical semiconductor laser amplifiers 21 and 22, an optical coupler 11 for dividing a signal light propagated through an input optical fiber 61 into two signal lights supplied to two optical fibers 113 and 114, and an optical coupler 12 for combining two signal lights of two optical fibers 121 and 122 and for dividing a combined signal light into two signal lights supplied to an output optical fiber 62 and a monitor optical fiber 124. Each of the optical couplers 11 and 12 is of a structure in which two single mode optical fibers each having a core diameter of 10 μm are melted to be connected in parallel by a predetermined length, and a dividing ratio thereof is one to one (1:1) at a wavelength of 1.55 μm and the loss therein is less than 0.1 dB. Each of the semiconductor laser amplifiers 21 and 22 is of a travelling wave type semiconductor laser amplifier in which both facets of an InGaAsP-/InP semiconductor laser is anti-reflection coated to have reflectivities below two percents. A photo-detector 3 is of a Ge photodiode and is provided to face the output of the monitor optical fiber 124 of the optical coupler 12. Each of the input and output optical fibers 61 and 62 is of a single mode optical fiber having a core diameter of 10 μm. Each end of the optical fiber couplers 113 and 114, and each end of the optical fiber couplers 121 and 122 are processed to be of spherical shapes with a radius of approximately 40 μm so that the ends thereof acts as lenses. The coupling loss between the optical fiber and the optical semiconductor laser amplifiers 21 and 22 is approximately 3 dB, respectively. The input and output optical fibers 61 and 62 are fusion-spliced to be connected to the optical couplers 11 and 12, respectively, with a splice loss of less than as small as 0.2 dB. In each of the optical semiconductor laser amplifiers 21 and 22, a threshold current is 50.1 mA for a laser oscillation, and amplification gains for signal lights of TE and TM waves are shown in FIG. 2 at a wavelength of 1.55 μm. At the injection current of 49.5 mA, the amplification gains is 38 dB for TE wave and 30 dB for TM wave, respectively.

In the embodiment, the 1.55 μm signal light power propagated through the optical fiber 61 is −35 dBm at the input end of the optical coupler 11. The signal light is equally divided in the optical coupler 11 to be supplied to the optical semiconductor laser amplifiers 21 and 22 in which a signal light power is −41 dBm at the inputs thereof because the coupling loss thereof is 3 dB as described before In a specified operation, the optical semiconductor laser amplifier 21 is controlled to provide an amplification gain of 30 dB, while the optical semiconductor laser amplifier 22 is controlled to be under "off-state" with an injection current of "zero" so that a signal light power of −14 dBm is supplied from the optical semiconductor laser amplifier 21 to the optical fiber 121, while no signal light is supplied from the optical semiconductor laser amplifier 22 to the optical fiber 122. Therefore, the signal light power is regenerated to the level of up to −17 dBm, and the regenerated signal light is supplied through the optical coupler 12 to the output optical fiber 62. In order to monitor the signal light power to the output optical fiber 62, part of the signal light from the optical fiber 124, which is a level of −17 dBm, is detected by the photo-detector 3. The monitor signal from the photo-detector 3 is then supplied to a control circuit 4 by which power supplies 51 and 52 are controlled to supply predetermined injection currents to the optical semiconductor laser amplifiers 21 and 22, respectively. In the present embodiment, an amplification gain of the optical semiconductor laser amplifier 21 is maintained to be 30 dB even when the polarization state of the input signal light is changed due to propagation of the optical fiber 61. This is done by varying output current of the power supply 51 by the control circuit 4 so that a monitor signal light level at the photo-detector 3 is converged to the aforementioned light power of −17 dBm. As clearly seen from the FIG. 2, the output current of the power supply 51 is in a range from 48.5 mA to 49.5 mA.

In the embodiment, in a case where the monitor signal light level of the photo-detector 3 can not be maintained to be −17 dBm even if the injection current is increased up to 49.7 mA, due to accidents such as a deterioration of the optical semiconductor laser amplifier 21, it is controlled by the control circuit 4 that the injection current of the optical semiconductor laser amplifiers 21 is fixed to be 49.7 mA and the optical semiconductor laser amplifier 22, which is not operate under normal situation, begins to operate together with the optical semiconductor laser amplifier 21. With this configuration, signal light to the optical fiber 62 can be regenerated to the level of −17 dBm by the optical semiconductor laser amplifier 22, normally, even if the signal light path of the optical semiconductor laser amplifier 21 is broken down due to the deterioration of the optical semiconductor laser amplifier 21. If it happens that both of the optical semiconductor laser amplifiers 21 and 22 are broken down due to the long term use, and thus the monitor signal light level can not be maintained to be −17 dBm, an alarm output signal is produced in the control circuit 4 and sent to an exterior circuit (not shown).

Figure 3:
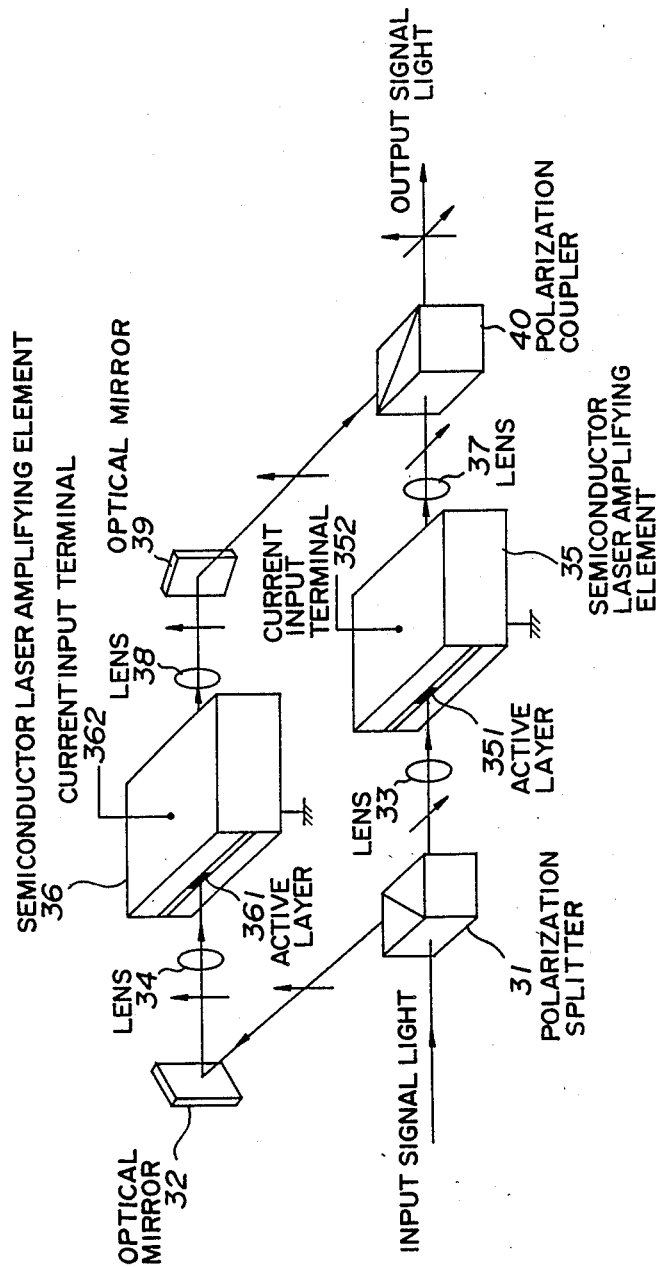

FIG. 3 shows an optical semiconductor laser amplifier which can be applied to the optical amplifying repeater in the aforementioned embodiment. The optical semiconductor laser amplifier includes optical semiconductor laser amplifying elements 35 and 36, a polarization beam splitter 31 for dividing an input signal light into two output signal lights having orthogonal polarizations each other, an optical mirror 32 for reflecting one of the two signal lights from the polarization beam splitter 31, lenses 33 and 34 for focussing the the two signal lights from the polarization beam splitter 31 and the signal light reflected by the optical mirror 32 on active layers 351 and 361 of the optical semiconductor laser amplifying elements 35 and 36 respectively, lenses 37 and 38 for collimating signal lights radiated from the optical semiconductor laser amplifying elements 35 and 36, an optical mirror 39 for reflecting the signal light collimated by the lens 38, and a polarization beam coupler 40 for combining the signal lights collimated by the lens 37 and reflected by the optical mirror 39 to produce an output signal light. In the illustration of the optical semiconductor laser amplifier in FIG. 3, vertical and horizontal arrows indicate directions of electric fields of the signal lights, respectively.

In FIG. 3, each of the polarization beam splitter and coupler 31 and 40 is made of two glass prisms with right-angle triangle which is combined to the other by plane to plane together. Each of the optical semiconductor laser amplifying elements 35 and 36 is of an InGaAsP/InP travelling wave type semiconductor laser which facets are with antireflection films to have reflectivities of less than two percents. The optical semiconductor laser amplifying elements 35 and 36 have, respectively, the active layer 351, 361 with a thickness of approximately 0.1 μm, a width of approximately 1.5 μm and a length of approximately 300 μm.

An amplification gain of the InGaAsP/InP travelling-wave type semiconductor laser amplifying element is different between TE and TM waves at a wavelength of 1.55 μm as explained in FIG. 2. Each of the lenses 33, 34, 37 and 38 is of the so-called selfoc lens (a rod lens) with a spherical shape at the tip thereof and having a focal length of 5 mm and a coupling loss of 3 dB, and each of the optical mirrors 32 and 29 is of a mirror made by an evaporation of Au, which reflectivity is 99%.

In operation, an input signal light, which is to be amplified in the optical semiconductor laser amplifying elements 35 and 36, having a wavelength of 1.55 μm is divided by the polarization splitter 31 into TE wave and TM wave. The TE wave is launched by the lens 33 to the active layer 351 of the optical semiconductor laser amplifying element 35 in which the TE wave is amplified, and the TM wave is reflected by the optical mirror 32 so that the TM wave is coupled by the lens 34 to the active layer 361 of the optical semiconductor laser amplifying element 36 in which the TM wave is amplified. The TE wave thus amplified in the optical semiconductor laser amplifying element 35 is supplied through the lens 37 to the polarization coupler 40, while the TM wave thus amplified in the optical semiconductor laser amplifying element 36 is supplied through the lens 38 to the optical mirror 39, thereby being reflected to be supplied to the polarization coupler 40. In the polarization coupler 40, signal lights of the both polarization components are combined to be coupled as an amplified signal light to the optical fiber of a following stage. Amplification gains of the optical semiconductor laser amplifying elements 35 and 36 are controlled to be varied by adjusting injection currents supplied to current input terminals 352 and 362 thereof, respectively, in accordance with a monitor signal as explained in the embodiment.

Next, principle and operation of the invention will be explained.

As explained before, an input signal light is divided to be supplied to plural optical semiconductor laser amplifiers, and each of the signals is amplified independently. Also, amplification gain of each of the plural optical semiconductor laser amplifier is controlled to be varied in accordance with a monitor signal. Consequently, the optical power of the amplified signal light can be kept to predetermined value even if a polarization of the input signal light propagated through an optical fiber is changed due to the external disturbance applied to the optical fiber, and amplification gains of the optical semiconductor laser amplifiers are fluctuated due to the change of an atmospheric temperature. Furthermore, a transmission line is prevented from being broken down because the optical power of the output amplified signal light can be maintained to be a predetermined level by increasing an amplification gain of at least one optical semiconductor laser amplifier among the plural optical semiconductor laser amplifiers even if one of the plural optical semiconductor laser amplifiers is damaged. In each of the optical semiconductor laser amplifiers, the input signal light is preferably divided into TE and TM waves as described before. The TE and TM waves are independently amplified in optical semiconductor laser amplifying elements and then combined. As a result, the amplified signal light which is obtained from the independent optical amplifications and the combination of each of amplified signal light components is ideally maintained to be a predetermined level even if the polarization state of the input signal light is extraordinarily changed.

This can be explained as follows. Let us define that the input signal light power is $P_{IN}$, a TE wave component of the input signal light is $a \cdot P_{IN}$, and a TM wave component of the input signal light is $(1-a)P_{IN}$. Here "a" is ranged as "$0 \leq a \leq 1$". Let us further define that an amplification gain of an optical semiconductor laser amplifying element for amplifying TE wave is $G_1$, and that of an optical semiconductor laser amplifying element for amplifying TM wave is $G_2$.

Under the above definitions, an amplified signal light power $P_{OUT}$ which is obtained from the amplifications of the TE and TM waves and the combination of the amplified TE and TM waves is given by the equation (1).

$$P_{OUT} = [C_1 a G_1 + C_2(1-a)G_2] \tag{1}$$

where $C_1$ and $C_2$ are loss coefficients determined in accordance with input and output couplings in the optical semiconductor laser amplifying elements for the TE wave and the TM wave, correspondingly.

If the following equation (2) is satisfied, the equation (3) is obtained from the equation (1).

$$C_1 G_1 = C_2 G_2 \tag{2}$$

$$P_{OUT} = C_2 G_2 P_{IN} = C_1 G_1 P_{IN} \tag{3}$$

As apparent from the equation (3), the amplified signal light power POUT is independent of the value "a". Consequently, the amplification gain of the output signal light is prevented from being fluctuated in spite of the polarization state change of the input signal light, if the amplification gains $G_1$ and $G_2$ of the optical semiconductor laser amplifying elements are set to satisfy the equation (2). In general, losses of a polarization splitter and a polarization coupler as adopted in FIG. 3 are as low as less than 1.0 dB. Therefore, an attenuation of the signal light is substantially negligible at stages of dividing the signal light and combining the signal lights. As described above, an optical amplifying repeater with excellent stability and reliability is obtained in the invention by using the preferred optical semiconductor laser amplifying elements.

In FIG. 4, there is shown an optical semiconductor laser amplifier which can be applied to the optical amplifying repeater in the aforementioned embodiment according t the invention wherein like parts are indicated by like reference numerals in FIG. 3. Only difference between the constructions shown in FIGS. 3 and 4 is that the optical semiconductor laser amplifying element 36 is provided to be rotated by ninety degrees as compared to that in FIG. 3.

In operation, the TM wave which is divided in the polarization divider 31 is supplied as TE wave to the optical semiconductor laser amplifying element 36. For the reason, injection current for the optical semiconductor laser amplifying element 36 is decreased to provide the same amplification gain as in the construction in FIG. 3. Even in the construction in FIG. 4, if the amplification gains of the optical semiconductor laser amplifying elements 35 and 36 are set to meet the equation (2), an output signal light is maintained to be a predetermined value without any influence from the polarization change of an input signal light. When the optical semiconductor laser amplifiers as explained in FIGS. 3 and 4 are adopted as those indicated by reference numerals 21 and 22 in FIG. 1, a control circuit can be simplified because the output amplified signal light is fluctuated only due to the change of the atmospheric temperature.

In the embodiment, although on optical semiconductor laser amplifier is of a travelling wave type using an InGaAsP system material, it may be of a Fabry-Perot resonator type or a distributed feedback type using other materials. Furthermore, a different kind of an optical laser amplifier using a solid material or gas may be used. A half-mirror may be used for the optical divider and the optical coupler, and an avalanche photo-diode and a photo-multiplier may be used for a photodetector. Furthermore, the number of dividing the signal light and of optical semiconductor laser amplifiers may be more than three. A polarization splitter and a polarization coupler may be of a polarization beam splitter using birefringence of calcite or crystal, or may be of Grand Tomson prism or Rochon's prism. The polarization divider, the polarization coupler and the optical mirror may be replaced by a polarization maintaining optical fiber coupler.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. An optical amplifying repeater comprising,
   an optical dividing means for dividing an input signal light propagated through a first transmission optical fiber into signal lights of a predetermined number,
   optical amplifiers of said predetermined number, each of said optical amplifiers amplifying a corresponding one of said signal lights to provide an amplified signal light,
   an optical combining means for combining said amplified signal lights from said optical amplifiers to supply a second transmission optical fiber with a combined signal light,
   a monitor means for the monitor of a level of said combined signal light to produce a monitor signal, and
   a control means for controlling an amplification gain of at least one optical amplifier among said optical amplifiers in response to said monitor signal whereby said level is held to be a predetermined value.

2. An optical amplifying repeater according to claim 1,
   wherein each of said optical amplifiers includes a polarization splitter for dividing a corresponding one of said signal lights of said predetermined number into polarization components of TE and TM waves, a plurality of optical semiconductor laser amplifying elements each amplifying a corresponding signal light of said polarization components independently, and a polarization coupler for combining amplified signal lights supplied from said plurality of optical semiconductor laser amplifying elements.

* * * * *